United States Patent [19]
Lin et al.

[11] Patent Number: 6,008,507
[45] Date of Patent: Dec. 28, 1999

[54] PHOTOELECTRIC SEMICONDUCTOR DEVICE HAVING A GAASP SUBSTRATE

[75] Inventors: Ying-Fu Lin, Miao Li; Liang-Tung Chang; Shiang-Peng Cheng, both of Hsinchu; Kuan-Chu Kuo, Hsiang; Chiao-Yun Lin; Fu-Chou Liu, both of Hsinchu, all of Taiwan

[73] Assignee: Kingmax Technology Inc., Hsinchu, Taiwan

[21] Appl. No.: 09/144,908

[22] Filed: Sep. 1, 1998

[51] Int. Cl.$^6$ .................. H01L 33/00; H01L 31/0328
[52] U.S. Cl. .............. 257/96; 257/98; 257/103; 257/190; 372/45; 372/46
[58] Field of Search .................... 257/13, 22, 94, 257/96, 98, 103, 190; 372/45, 46

[56] References Cited

U.S. PATENT DOCUMENTS 5,153,889  10/1992  Sugawara et al. .................... 257/96

*Primary Examiner*—Minh Loan Tran
*Attorney, Agent, or Firm*—Harness, Dickey & Pierce, P.L.C.

[57] ABSTRACT

A structure of a semiconductor light emitting device includes a GaAs substrate, a GaAsP interface substrate, a first cladding layer, an active layer, and a second cladding layer. The GaAsP interface substrate layer is formed on the GaAs substrate, in addition, the GaAsP interface substrate layer formed on the substrate is of a thickness such that the upper surface of the GaAsP interface substrate layer adjacent to the substrate is composed of single crystal. The first cladding layer of a first conductivity is formed on the GaAsP interface substrate layer. The active layer is formed on the first cladding layer, from which the light is generated in the active layer. The second cladding layer of a second conductivity is formed on the active layer.

18 Claims, 3 Drawing Sheets

<Prior Art>

PHOTOELECTRIC SEMICONDUCTOR DEVICE HAVING A GAASP SUBSTRATE

BACKGROUND OF THE INVENTION

1. Field of the Invention

This invention relates to a structure of a photoelectric semiconductor device, and particularly relates to a structure of a light emitted diode and a laser diode that can be fabricated with GaAsP substrate.

2. Description of the Prior Art

The photoelectric semiconductor devices is widely used in various applications, such as the light emitted diode is used to replace the cathode radiation tube recently. The throughput as well as the yield of the light emitted diode is getting more important, and the yield of the light emitted diode is greatly improved. However, the traditional light emitted diode has some problems such as the mismatch between the lattice in the substrate and the light emitting portion of the LED. Furthermore, the oxidation of the widely used material—aluminum may result the problems in manufacturing the traditional LED.

The structure of the traditional LED is shown in FIG. 1, in which the standard structure of the LED includes the window layer 1, the p-cladding layer 2, the active layer 3, the n-cladding layer 4, and the distributed bragged reflector (DBR) layer 5. In the traditional technology, the standard structure of the LED is formed on the substrate made of GaAs. In general, the window layer 1 is made of GaAsP, the p-cladding layer 2 is made of AlGaInP doped with III group semiconductor, the active layer 3 of the multi quantum well (MQW) structure or the double hetero-structure (DH) is made of undoped AlGaInP, the n-cladding layer 4 is made of AlGaInP doped with V group semiconductor, and the DBR layer 5, which is not necessary in a complete LED, is usually made of AlInP and AlGaInP.

Because the lattice constant of the substrate 6 is greater than that of the partial LED structure 10 mentioned above, the lattice mismatch is resulted, and the problems in manufacturing the traditional LED is resulted. The lattice constant of the GaAs substrate 6 is about 5.6 angstroms, so the In ingredient in the partial LED structure 10 must be reduced to 0.482–0.486 to make the lattice match. The structure of the traditional LED is formed by a traditional method described in the following description. As shown in FIG. 1, a distributed bragg reflector (DBR) layer 5 of the first conductivity is formed on the substrate 6. Then form the n-cladding layer 4 on the DBR layer 5, and form the active layer 3 on the n-cladding layer 4 by the LPE (Liquid Phase Expitaxy) method. Subsequently, form a p-cladding layer 2 on the active layer 3 with the additional Zn doping, and then form a window layer 1, which is not necessary for the LED, on the p-cladding layer 2. Finally, form the first electrode 7 on the window layer 1, and form the second electrode 8 on the substrate 6. Thus the traditional LED is manufactured.

In addition, when the phosphorus content z of the active layer 3 (GaAsP,) is equal to 0.39, the manufactured LED mentioned above emits the red light. If the LED is designed to emit the light of short wavelength such as the light of orange color or yellow color, the phosphorus ingredient z of the active layer 3 must be adjusted to 0.75 or 0.85. Furthermore, the adequate material used in fabricating the substrate 6 in the forgoing LED, which emits the light of short wavelength such as the orange or the yellow light, must be changed to GaP. Unfortunately, when the phosphorus content of the active layer 3 is larger than 0.5, the LED can not emit light because of the indirect band gap. In order to overcome the indirect band gap mentioned above, the nitrogen deposition is utilized to result in the isoelectronic center, which overcomes the indirect band gap mentioned above.

If the traditional LED mentioned above is designed to emit the green light, aluminum must be added in manufacturing the traditional LED. Because the aluminum tempts to react with the oxygen, so it is not easy to manufacture the LED emitting the green light according to the traditional method. In addition, the lattice mismatch between the GaAs substrate 6 and the partial LED structure 10 shown in FIG. 1, results in the serious problem in manufacturing the traditional LED mentioned above.

SUMMARY OF THE INVENTION

A light emitting diode (LED) used for emitting a light according to the present invention includes the GaAs substrate, the GaAsP interface substrate, the distributed bragged reflector (DBR) layer, the first cladding layer, the active layer, the second cladding layer, and the window layer. The GaAsP interface substrate is formed on the GaAs substrate. The distributed bragged reflector (DBR) layer is formed on the GaAsP interface substrate. The distributed bragged layer is fabricated by alternatively forming a first AlGaInP layer and a first AlInP layer or alternatively forming a first AlAs layer and a first AlGaAs layer. The first AlGaInP layer, the first AlInP layer, the first AlAs layer, and the first AlGaAs layer are of the thickness about half of a wavelength of the light.

The first cladding layer of a first conductivity is formed on the distributed bragged reflector layer, and the active layer is formed on the first cladding layer, the light being generated in the active layer. The second cladding layer of a second conductivity is formed on the active layer. The window layer is formed on the second cladding layer. The window layer mentioned above includes the GaAsP.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

Figure 1:
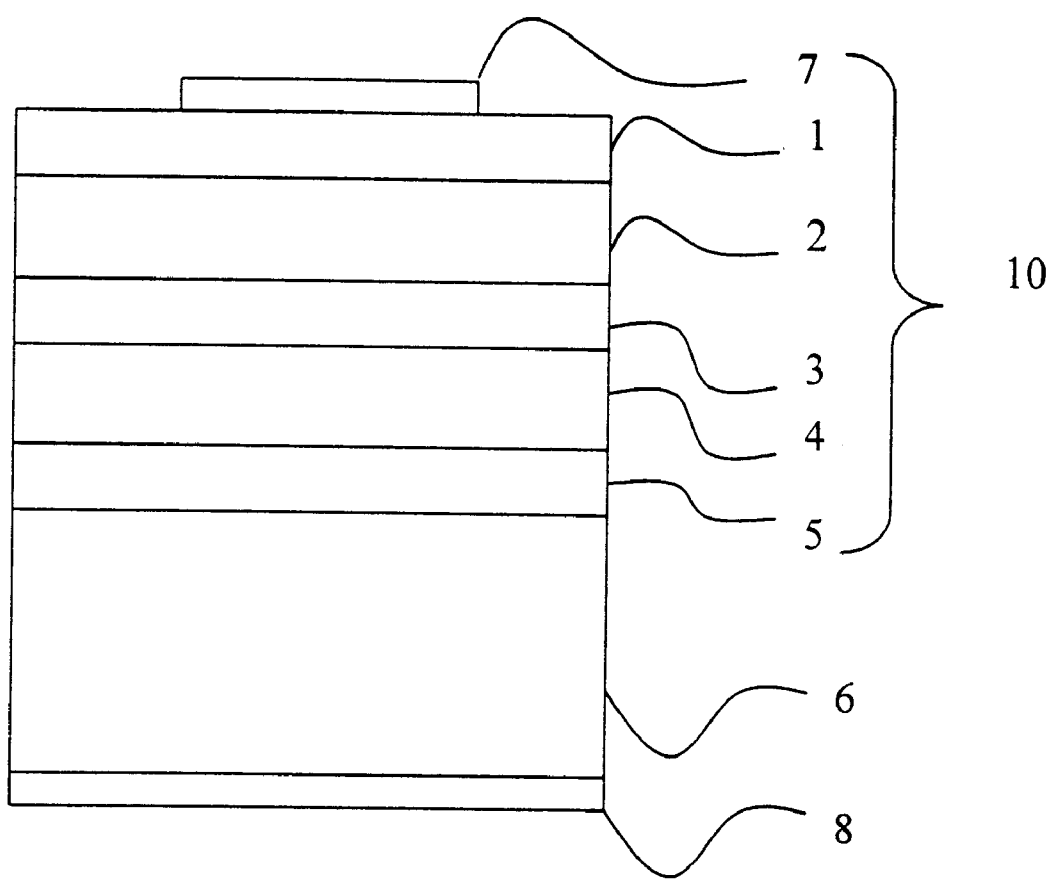
FIG. 1 shows the cross sectional view of the structure of the traditional light emitted diode (LED) fabricated on the substrate according to the prior art.

Because the AlGaInP materials are direct transition-type materials with the largest band gap energies among III–V compound semiconductor mixed crystals except nitrides and are receiving much as materials for visible light emitted device in the 550–650 nm (nano meter) band (green to red region). In addition, the light emitted devices using the AlGaInP materials with such large direct band gap energies can produce light emission with much higher brightness than the traditional ones using indirect transition-type materials such as GaP or GaAsP. So a preferred embodiment of the present invention utilizes the AlGaInP materials to manufacture the partial LED structure 10 (shown in FIG. 1). The preferred embodiment of the present invention utilizes the GaAsP to form the interface substrate between the substrate GaAs and the partial LED structure 10 (shown in FIG. 1).

Figure 2:
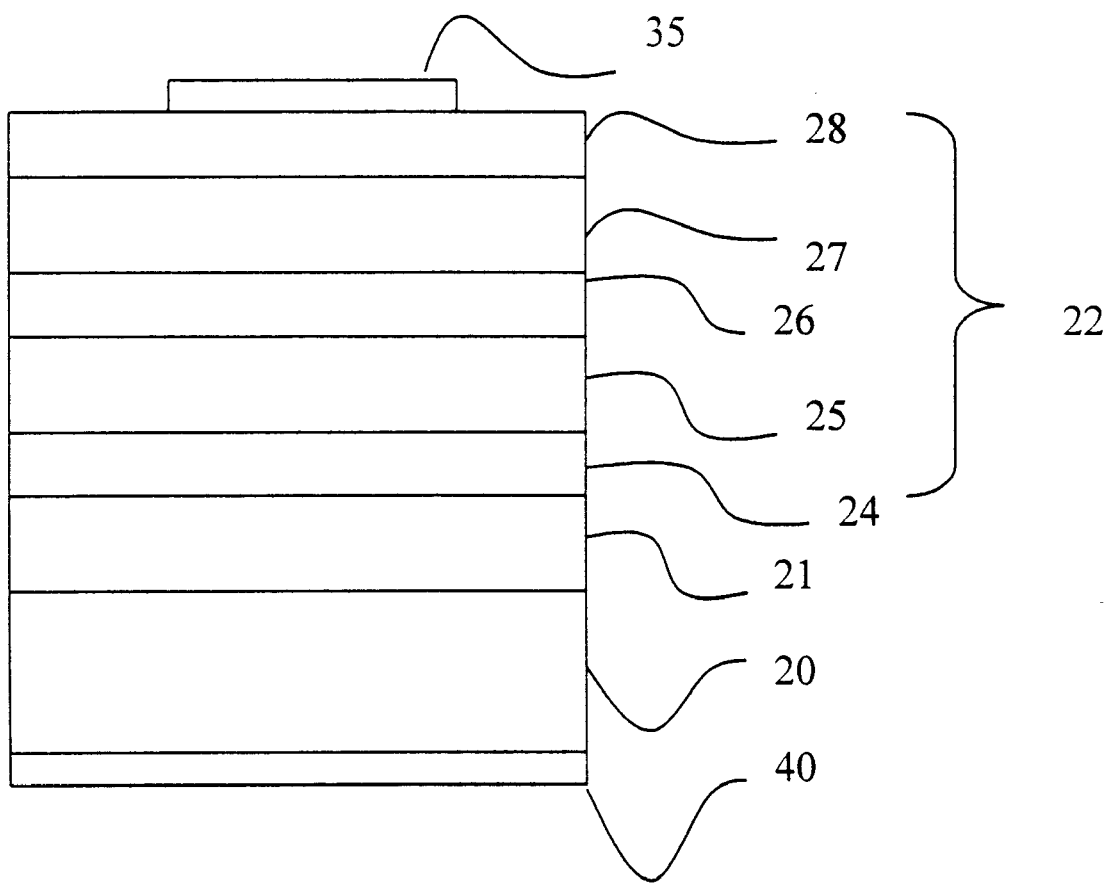
FIG. 2 shows the cross sectional view of the structure of the traditional light emitted diode (LED) fabricated on the substrate according to the preferred embodiment of the present invention.

The present invention can be used to fabricate the light emitted device such as light emitted diode (LED), laser diode (LD), and solar cell. To illustrate the present invention, the structure of LED is taken for example in the preferred embodiment of the invention. As shown in FIG. 2, one preferred embodiment of the present invention provides a substrate 20, which can be made of GaAs or GaP. The interface substrate 21 is formed on the substrate 20, and then the partial LED structure 22 is formed on the interface substrate 21. In forming the interface substrate 21, the metal organic vapor phase expitaxy (MOVPE) is used to form the GaAsP interface substrate 21, and the necessary thickness of the interface substrate 21 is approximately more than 1 $\mu$m (micron), thus the latest formed interface substrate 21 is composed of single crystal. In other words, the surface of the interface substrate 21 adjoining the DBR layer 24 includes single crystal, and the lattice match between the interface substrate 21 and the DBR layer 24 is resulted. The DBR layer 24 in one preferred embodiment of the present invention can be made by alternately forming AlInP layer and AlGaInP layer, or alternately forming AlAs layer and AlGaAs layer. The AlInP layer, the AlGaInP layer, the AlAs layer, and the AlGaAs layer in the DBR layer 24 are about one fourth of the wavelength of the emitted light.

Similar to the partial LED structure 10 (shown in FIG. 1), the LED structure 22 of the LED according to the preferred embodiment of the present invention includes the distributed bragged reflector (DBR) layer 24, the n-cladding layer 25, the active layer 26, the p-cladding layer 27, and the window layer 28. The LED structure 22 mentioned above has the same structure as that of the partial LED structure 10 (shown in FIG. 1) except the materials used to manufacture the LED structure 22. Subsequently, form the n-cladding layer 25 on the DRB layer 24, in which the n-cladding layer 25 is made of alternatively forming AlGaInP layer and AlInP layer or alternatively forming AlAs layer and AlGaAs layer, which doped with the V group semiconductor. Next, form an active layer 26 of the multi quantum well (MQW) structure or the double hetero-structure (DH) that is made of undoped AlGaInP, or GaInP.

The next step is to fabricate a p-cladding layer 27 on the active layer 26, the p-cladding layer 27 is made of alternatively forming AlGaInP layer and AlInP layer or alternatively forming AlAs layer and AlGaAs layer, which doped with III group semiconductor. When the light emitted device that will be fabricated is a light emitted diode (LED), the AlGaInP layer, AlInP layer, AlAs layer and AlGaAs layer mentioned in the p-cladding layer 27 are of the thickness about half the wavelength of the emitted light. When the light emitted device that will be fabricated is a laser diode (LD), the AlGaInP layer, AlInP layer, AlAs layer and AlGaAs layer mentioned in the p-cladding layer 27 are of the thickness about one fourth of the wavelength of the emitted light. Finally, form a window layer 28 that is made of GaAsP on the p-cladding layer 27. To implement the function of the LED mentioned above, the first electrode 35 is formed on the window layer 28, and the second electrode 40 is formed on the substrate 20.

When a voltage is applied across the first electrode 35 and the second electrode 40, the current from the first electrode 35 is induced. Furthermore, the induced current is dispersed over the surface of the p-cladding layer 27 by the window layer 28, so the induced current can distribute uniformly and flow through the LED. The n-cladding layer 25, the active layer 26, and the p-cladding layer 27 are the main partition that emits the light, and most of the light that incident the DBR layer 24 is reflected by the DBR layer 24. So the DBR layer 24 is not necessary for a basic structure LED, in other words, the LED according to the preferred embodiment of the present invention can emit the light without the DBR layer 24.

In the other preferred embodiment of the present invention, the partial LED structure 22 mentioned above only includes the n-cladding layer 25, the active layer 26, and the p-cladding layer 27. Namely, the window layer 28 and the DBR layer 24 are not used in the other preferred embodiment of the present invention. In the other preferred embodiment of the present invention, the partial LED structure 22 is formed directly on the interface substrate 21, and the interface substrate 21 is formed on the substrate 20 directly. As illustrated in the LED mentioned in one preferred embodiment of the present invention, the LED according to the structure of the other preferred embodiment of the present invention can be used to emit the light without the window layer 28 and the DBR layer 24 shown in FIG. 2.

Because the partial LED structure 22 is formed on the interface substrate 21 directly. Thus the difference of the lattice constant between the DBR layer 24 (AlGaInP or AlInP) and the interface substrate 21 (GaAsP) is smaller than the difference of the lattice constant between the DBR layer 5 (formed of AlGaInP or AlInP, shown in FIG. 1) and the substrate 6 (formed of GaAs or GaP, shown in FIG. 1). The lattice constant in the partial LED structure 22 in the preferred embodiments of the present inventions is about 5 angstroms, which is smaller than 5.6 angstroms in the prior art. So the energy gap within the preferred embodiments of the present invention is larger than that of the prior art. The ingredient y of In contained in AlGaIn$_y$P (or GaIn$_y$P) within LED structure according to the preferred embodiments of the present invention must be adjusted to about 0.31 or 0.35 in the preferred embodiments of the present invention determined by the ingredient z of P content in GaAsPz substrate. When z is equal to 0.39 and 0.3, y is equal to 0.31 and 0.35 respectively.

Figure 3:
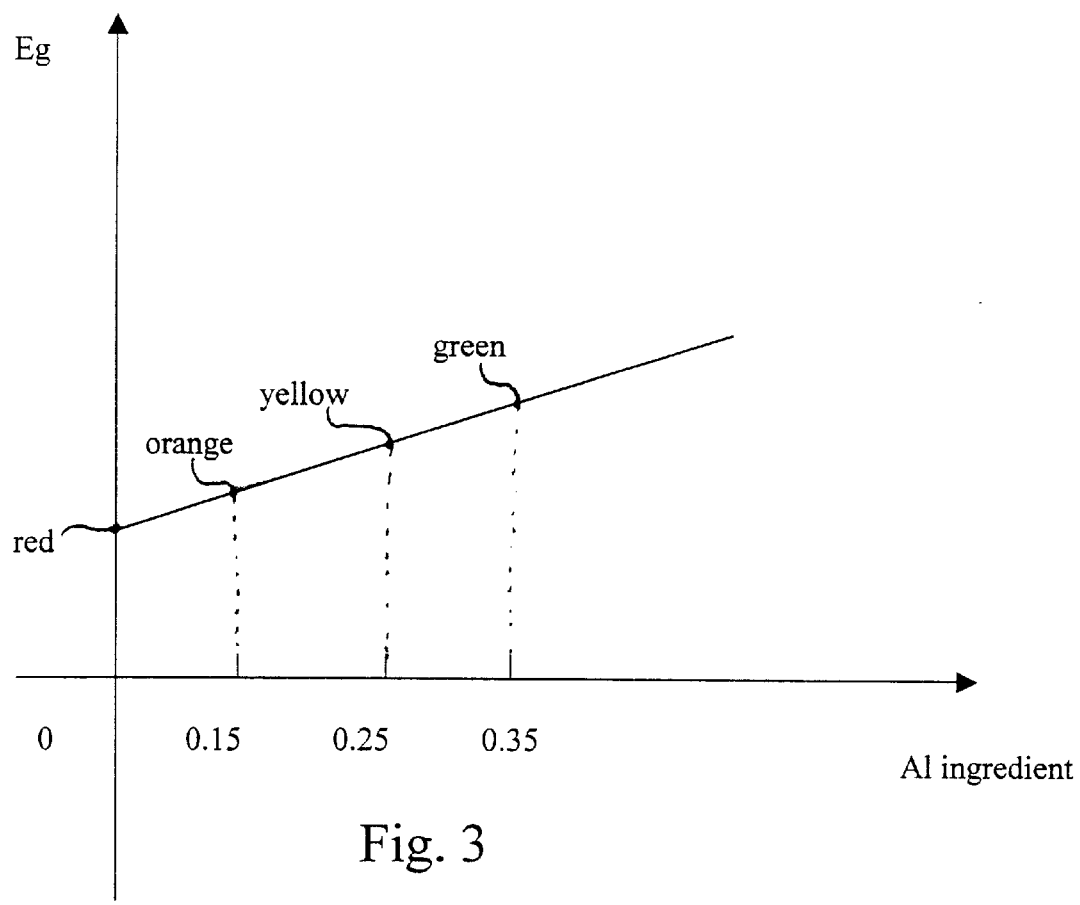
FIG. 3 shows the relationship between the Al ingredient in the LED structure and the energy gap (Eg) within the LED structure according to the preferred embodiment of the present invention.

Refer to FIG. 3, the horizontal coordinate represents the ingredient of aluminum in AlGaInP within the LED structure. The vertical coordinate in FIG. 3 represents the energy gap in the LED structure according to the preferred embodiments of the present invention. When the Al ingredient is 0, as shown in FIG. 3, the energy gap is the smallest, and the emitted light is a red light. When the Al ingredient is 0.15, the emitted light is an orange light. When the Al ingredient is 0.25, the emitted light is a yellow light. When the Al ingredient is 0.35, the emitted light is a green light. Furthermore, because the AlGaInP used to from the LED structure according to the preferred embodiments of the present invention can be replaced with GaInP, the Al ingredient can be eliminated when fabricating the LED in the preferred embodiments of the present invention. So the problem of aluminum oxidation in fabricating the LED in the preferred embodiments of the present invention is avoided.

As will be understood by persons skilled in the art, the foregoing preferred embodiment of the present invention is illustrative of the present invention rather than limiting the present invention. Having described the invention in connection with a preferred embodiment, for example, if the LED or LD of various structures is fabricated on the GaAsP substrate in the preferred embodiment, the modification will now suggest itself to those skilled in the art. While the preferred embodiment of the invention has been illustrated and described, it will be appreciated that various changes can be made therein without departing from the spirit and scope of the invention.

What is claimed is:

1. A structure of a semiconductor light emitted device for transforming a current to emit a light, said structure of said semiconductor light emitted device comprising:

a substrate;

a GaAsP layer formed on said substrate, said GaAsP layer being of a thickness that a surface of said GaAsP layer adjacent to said substrate being composed of single crystal;

a first cladding layer of a first conductivity formed on said GaAsP layer;

an active layer formed on said first cladding layer, said light being generated in said active layer according to said current; and a second cladding layer of a second conductivity formed on said active layer.

2. The structure as claim 1, wherein said thickness of said GaAsP layer is more than 1 micron.

3. The structure as claim 1, wherein said light emitted device is chosen from the group consisting: light emitting diode (LED), laser diode (LD), and solar cell.

4. The structure as claim 1, wherein said substrate comprises GaAs.

5. The structure as claim 1, wherein said first cladding layer is fabricated by alternatively forming a first AlInP layer and a first AlGaInP layer, followed by doping with a V group semiconductor to form said first conductivity.

6. The structure as claim 1, wherein said first cladding layer is fabricated by alternatively forming a first AlAs layer and a first AlGaAs layer, followed by doping with a V group semiconductor to form said first conductivity.

7. The structure as claim 1, wherein said active layer is formed of one of the structure comprising: the multi quantum well (MQW) structure and the double hetero-structure (DH), said active layer being choosen from the group consisting of: undoped AlGaInP, and undoped GaInP.

8. The structure as claim 1, wherein said second cladding layer is fabricated by alternatively forming a second AlInP layer and a second AlGaInP layer, followed by doping with a III group semiconductor to form said second conductivity, said second AlInP layer and said second AlGaInP layer being of a thickness about one fourth of a wavelength of said light.

9. The structure as claim 1, wherein said second cladding layer is fabricated by alternatively forming a second AlAs layer and a second AlGaAs layer, followed by doping with a III group semiconductor to form said second conductivity, said second AlAs layer and said second AlGaAs layer being of a thickness about one fourth of a wavelength of said light.

10. A structure of a light emitted diode (LED) for transforming a current to emit a light, said structure of said light emitted diode (LED) comprising:

a substrate;

a GaAsP layer formed on said substrate, said GaAsP layer being of a thickness that a surface of said GaAsP layer adjacent to said substrate being composed of single crystal;

a distributed bragged reflector (DBR) layer formed on said GaAsP layer, said distributed bragged layer being fabricated by forming a first AlGaInP layer and a first AlInP layer or alternatively forming a first AlAs layer and a first AlGaAs layer, said first AlGaInP layer, said first AlInP layer, said first AlAs layer, and said first AlGaAs layer being of a thickness about one fourth of a wavelength of said light;

a first cladding layer of a first conductivity formed on said distributed bragged reflector layer;

an active layer formed on said first cladding layer, said light being generated in said active layer according to said current, said light generated by said active layer being reflected by said distributed bragged reflector (DBR) layer;

a second cladding layer of a second conductivity formed on said active layer; and a window layer formed on said second cladding layer, said window layer being used to disperse said current comprising a GaAsP material.

11. The structure as claim 10, wherein said thickness of said GaAsP layer is more than 1 micron.

12. The structure as claim 10, wherein said substrate comprises GaAs.

13. The structure as claim 10, wherein said first cladding layer is fabricated by alternatively forming a second AlInP layer and a second AlGaInP layer, followed by doping with a V group semiconductor to form said first conductivity.

14. The structure as claim 10, wherein said first cladding layer is fabricated by alternatively forming a second AlAs layer and a second AlGaAs layer, followed by doping with a V group semiconductor to form said first conductivity.

15. The structure as claim 10, wherein said active layer is formed of one of the structure comprising: the multi quantum well (MQW) structure and the double hetero-structure (DH), said active layer being chosen from the group consisting of: undoped AlGaInP, and undoped GaInP.

16. The structure as claim 10, wherein said second cladding layer is fabricated by alternatively forming a third AlInP layer and a third AlGaInP layer, followed by doping with a III group semiconductor to form said second conductivity, said third AlInP layer and said third AlGaInP layer being of a thickness about half of a wavelength of said light.

17. The structure as claim 10, wherein said second cladding layer is fabricated by alternatively forming a third AlAs layer and a third AlGaAs layer, followed by doping with a III group semiconductor to form said second conductivity, said third AlAs layer and said third AlGaAs layer being of a thickness about half of a wavelength of said light.

18. A structure of a laser diode (LD) for transforming a current to emit a light, said structure of said laser diode (LD) comprising:

a GaAs substrate;

a GaAsP layer formed on said substrate, said GaAsP layer being of a thickness that a surface of said GaAsP layer adjacent to said substrate being composed of single crystal, said thickness of said GaAsP layer being more than about 1 micron;

a distributed bragged reflector (DBR) layer formed on said GaAsP layer, said distributed bragged layer being fabricated by forming a first AlGaInP layer and a first AlInP layer or alternatively forming a first AlAs layer and a first AlGaAs layer, said first AlGaInP layer, said first AlInP layer, said first AlAs layer, and said first AlGaAs layer being of a thickness about one fourth of a wavelength of said light;

a first cladding layer of a first conductivity formed on said distributed bragged reflector layer, said first cladding layer being fabricated by alternatively forming a second AlInP layer and a second AlGaInP layer or alternatively forming a second AlAs layer and a second AlGaAs layer, said first cladding layer being doped with a V group semiconductor to form said first conductivity;

an active layer formed on said first cladding layer, said light being generated in said active layer according to said current, a structure of said active layer being formed from a group consisting of: a multi quantum well (MQW) structure and a double hetero-structure (DH), said active layer being chosen from the group consisting of: undoped AlGaInP, and undoped GaInP, said light generated by said active layer being reflected by said distributed bragged reflector (DBR) layer;

a second cladding layer of a second conductivity formed on said active layer, said second cladding layer being fabricated by alternatively forming a third AlInP layer and a third AlGaInP layer or by alternatively forming a third AlAs layer and a third AlGaAs layer, said third AlInP layer, said third AlGaInP layer, said third AlAs layer and said third AlGaAs layer being of a thickness about one fourth of a wavelength of said light, said second cladding layer being doped with a III group semiconductor to form said second conductivity; and a window layer formed on said second cladding layer, said window layer comprising a GaAsP material, said window layer being used to disperse said current comprising a GaAsP material.

\* \* \* \* \*